Figure 1:
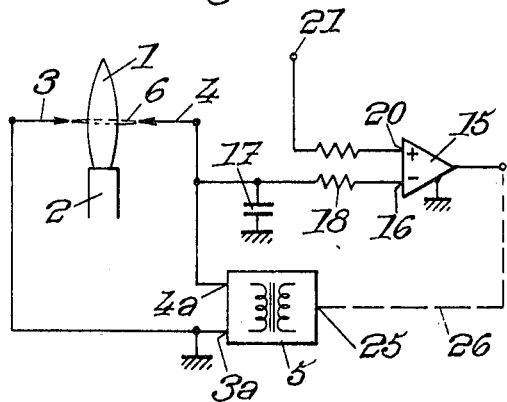

United States Patent [19]

Courier de Méré

[11] 4,167,767
[45] Sep. 11, 1979

[54] FLAME OR SPARK DETECTION SYSTEM AND COMBUSTIBLE GAS IGNITION DEVICE

[75] Inventor: Henri E. Courier de Méré, Paris, France

[73] Assignee: Bicosa Societe de Recherches, Clichy, France

[21] Appl. No.: 815,408

[22] Filed: Jul. 13, 1977

[30] Foreign Application Priority Data

Jul. 15, 1976 [FR] France ............... 76 21669

[51] Int. Cl.² .................................. F23Q 3/00
[52] U.S. Cl. .......................... 361/256; 431/78
[58] Field of Search ................. 361/256, 257; 340/228.1; 431/78, 80, 71, 74

[56] References Cited

U.S. PATENT DOCUMENTS

| | | | |
|---|---|---|---|
| 3,291,183 | 12/1966 | Fairly | 431/74 |
| 3,662,185 | 5/1972 | Sapir | 361/256 |
| 3,718,423 | 2/1973 | Matthews | 361/256 |
| 3,766,441 | 10/1973 | Gray | 340/228.1 |
| 3,879,667 | 4/1975 | Kraty et al. | 340/228.1 |
| 3,883,246 | 5/1975 | Courier de Mere | 361/256 |
| 4,025,284 | 5/1977 | Horn et al. | 361/257 |

FOREIGN PATENT DOCUMENTS

| | | | |
|---|---|---|---|
| 2326839 | 12/1974 | Fed. Rep. of Germany | 431/78 |
| 1598450 | 8/1970 | France | 361/256 |
| 2029615 | 10/1970 | France | 361/256 |

Primary Examiner—Bruce A. Reynolds
Assistant Examiner—Clifford C. Shaw
Attorney, Agent, or Firm—Gajarsa, Liss & Conroy

[57] ABSTRACT

A flame detection system responsive to an arc triggering voltage in a spark gap having at least a portion located in a flame is used to control spark generating equipment. A pulse generator used to trigger the arc is inhibited upon detection of a lowered spark triggering voltage resulting from ignition of a flame.

14 Claims, 7 Drawing Figures

FLAME OR SPARK DETECTION SYSTEM AND COMBUSTIBLE GAS IGNITION DEVICE

Applications: Ignition circuit in particular for pocket lighter or boiler.

The invention relates to a flame or spark detection system as well as to a combustible gas ignition device including such a detection system.

The main object of the invention is to provide a flame or spark detection system and an ignition device including such a system which provides satisfactory operational reliability and is particularly simple and economic to realize.

The flame or spark detection system according to the invention is characterized in that it includes, in combination:

a first and a second electrode, the ends of which are separated by a space located at the place where the flame is normally to be found, or close to this place, voltage generation means having first and second terminals respectively connected to the first and second electrodes, these generation means being suitable for causing an electric arc or spark between the aforesaid electrodes, and means which are sensitive to the potential difference between the aforesaid electrodes when an electric arc is produced between these electrodes, these means being suited for transmission of a first level signal when the aforesaid potential difference has a pre-determined value and a second level signal when this potential difference is greater than the aforesaid value.

During experiments performed within the framework of the invention, in effect, the inventor established that the voltage between the spark-gap electrodes, when in operation (which is to say when an electric arc is created between the electrodes), has a value which varies significantly, depending on whether the flame is present or absent. In particular, it was shown that the voltage for triggering the arc between the electrodes had a value which was significantly lower when the flame was present compared with when it was absent. Therefore the invention makes use of this property.

In an analogous fashion, it has been established that the voltage between the electrodes reaches a significantly greater value when the electric arc is not triggered compared with when a spark is produced.

By preference, the aforesaid voltage generator is a pulse generator suited for producing successive sparks between the aforesaid electrodes.

According to another of its aspects, the invention concerns a combustible gas ignition system which includes voltage generation means having first and second output terminals and a spark gap including a first and second electrode, respectively connected to the first and second output terminals of the voltage generation means. As in the case of the previously defined flame or spark detection system conforming to the invention, in the ignition system of this invention, the above mentioned property, which is to say that the voltage between the spark gap electrodes, particularly the arc trigger voltage, has a significantly different value depending on whether the flame is present or absent, is made use of. Under these conditions, the ignition system of the invention is characterized in that it includes means sensitive to the voltage between the spark gap electrodes when an electric arc is produced between these electrodes, these means being able to transmit a first level signal when the voltage between the electrodes is less than a pre-determined value and a second level signal when this voltage is greater than the pre-determined value; finally, the voltage generation means includes an inhibit input which is sensitive to the first level signal in such a way that the presence of such a signal on the inhibit input stops the generation means operating. Thus the presence of a flame to stop the voltage generation means operating is made use of. In other terms, operation of the voltage generation means is stopped when the flame appears; thus in large measure the drain on the power supply source for the voltage generation means can be reduced, whilst being certain that ignition has been produced.

In other words the invention has essentially for an object a flame detection system associated with flame generator, the latter apparatus including:

an autonomous direct current source,
a manual switch,
a controlled switch,
voltage step-up means, the input of which is only connected to the aforesaid source when the aforesaid manual switch and the controlled switch are both closed,
a capacitor connected at the output of the said voltage step-up means,
a voltage step-up transformer,
a spark gap producing sparks connected between terminals of the secondary of the said transformer,
a burner located close to the spark gap and able to be ignited by the sparks produced by the said spark gap,
a discharge circuit connected between the terminals of the said capacitor and including in series with the primary of the said transformer a triggering component,
means for making the said triggering component conduct when the charge of the said capacitor has reached a specified value, allowing the generation of a spark between the electrodes of the spark gap by discharge,
said flame detection system being characterized in that it includes, in combination with the aforesaid autonomous direct current source and the aforesaid controlled switch, means sensitive to the potential difference between the said electrodes when an electric arc is produced between them, these means being suited for transmitting a first signal of a first level when the aforesaid potential difference is at least equal to a first value which is predetermined corresponding to the presence of an electric arc between the aforesaid electrodes and a second electric signal of a second level when the aforesaid potential difference is at least equal to a second pre-determined value corresponding to absence of the electric arc between the aforesaid electrodes, the aforesaid first signal being able to open the first controlled switch and therefore to interrupt the supply for the input of the said voltage step-up means from the aforesaid autonomous direct current source, even if the manual switch is closed.

In the case where the voltage generation means of the flame detection or ignition system conforming to the invention includes a pulse generator designed to produce successive sparks between the electrodes and in the case where the voltage sensitive means between the aforesaid electrodes includes means which are sensitive to the electric arc triggering voltage, it is advantageous for these means sensitive to the triggering voltage to include an integrator adapted for integrating the voltage between the aforesaid electrodes for each spark, and comparator means the first input of which is connected to the integrator output and the second input of which is connected to the reference source able to produce a signal representative of a voltage of which the value is between the electric arc triggering voltage in the presence of the flame on one hand and the triggering voltage in the absence of the aforesaid flame on the other hand. As a variant the aforesaid means sensitive to the triggering voltage includes a threshold component such as the Zener diode, triggerable by a threshold voltage of value between a voltage representing the arc triggering voltage in the presence of a flame and voltage representing the arc triggering voltage in the absence of the flame.

Also in the case of voltage generation means including a pulse generator, by preference the latter includes a voltage step-up type output transformer. In this case, the voltage between the aforesaid electrodes can be measured across the secondary winding terminals or across the terminals of the primary winding of the said transformer. It should be noted here that the value of current passing through the primary winding or the secondary winding gives an indication of the value of the voltage between the electrodes.

Figure 2:
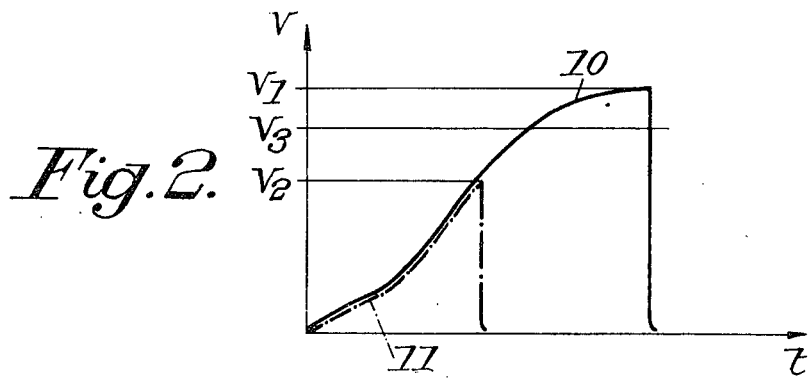
Figure 3:
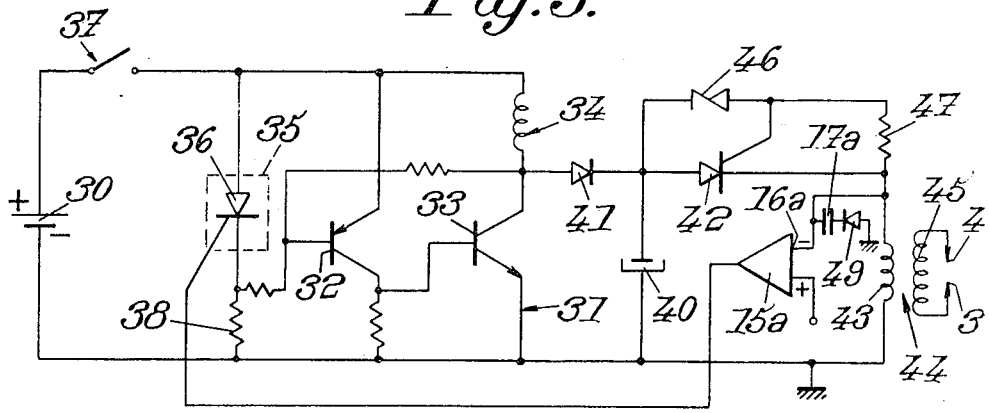
Figure 4:
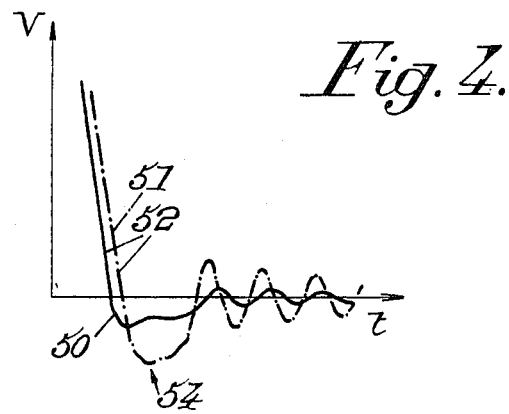
Figure 5:
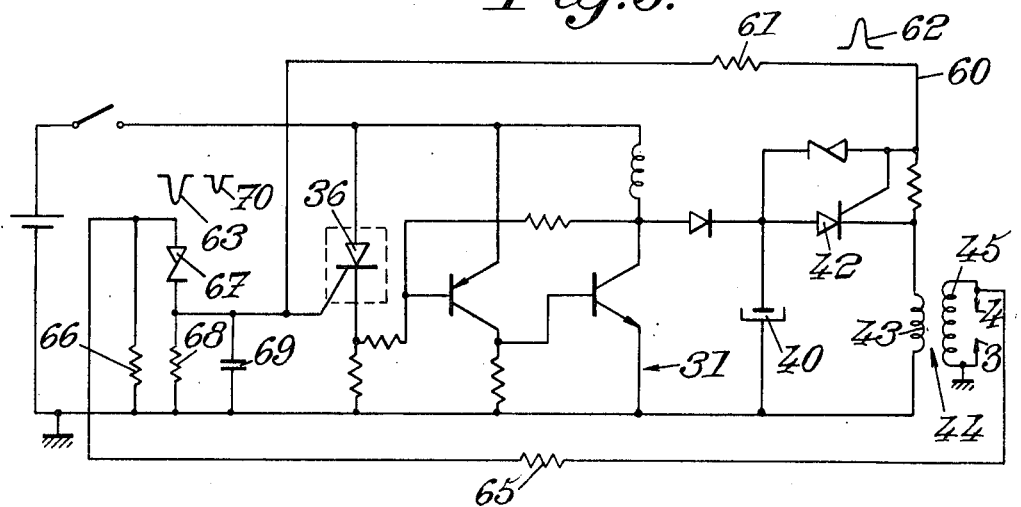
Figure 6:
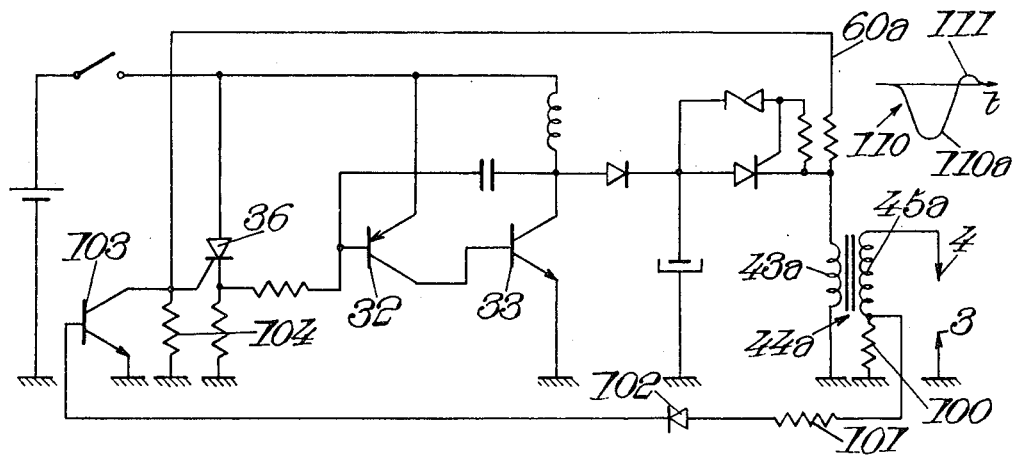
Figure 7:
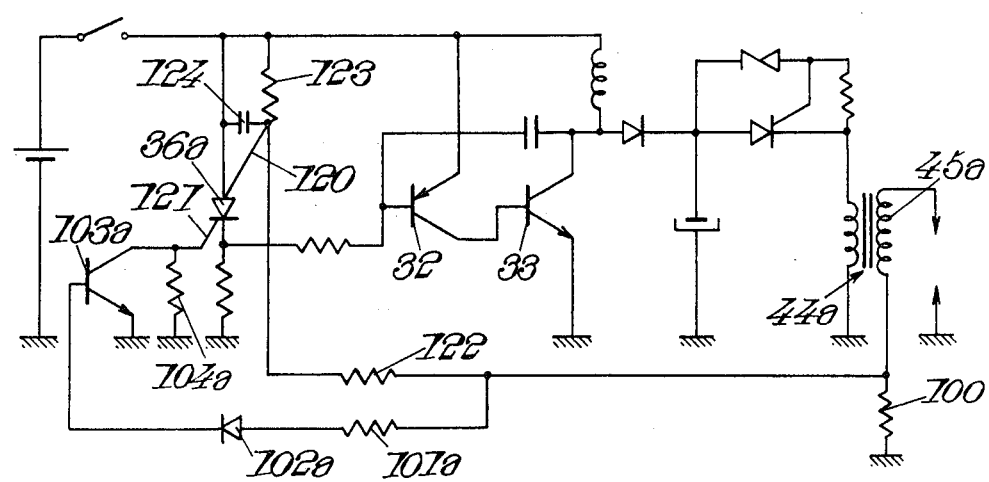

Other objects, embodiments and advantages of the invention appear when reading the description of certain of the modes of implementation, this description being made in referring to the appended drawings on which:

FIG. 1 shows the flame and ignition detection system conforming to the invention in schematic form, FIG. 2 is a graph illustrating the principle of operation of the detection system conforming to the invention, FIG. 3 shows a combustible gas ignition device conforming to the invention in a detailed fashion, FIG. 4 is a graph partially illustrating operation of the device shown in FIG. 3, FIG. 5 illustrates another mode of implementing an ignition device conforming to the invention, and FIGS. 6 and 7 show two more modes of implementing an ignition device conforming to the invention.

The system of FIG. 1 is intended to detect presence or absence of flame 1 resulting from the combustion of a combustible fluid, in particular a gas, leaving burner 2.

According to the invention, this system has two electrodes, 3 and 4 respectively, of the type used for making a spark gap, and generator 5 including two output terminals 3a and 4a. Terminal 3a is connected to electrode 3 whilst terminal 4a is connected to electrode 4. Generator 5 is designed to produce an electric arc 6 between the ends of electrodes 3 and 4, which in the preferred implementation mode of this invention is in the form of sparks. In the latter case generator 5 is clearly a pulse generator.

Electrodes 3 and 4 are arranged with respect to burner 2 in such a way that at least a part of electric arc 6 is positioned in the flame (when it exists) or in the immediate neighbourhood of this flame. In general, and above all in the case where the detection system must operate continuously, it is preferable for the ends of electrodes 3 and 4 to not be swept by flame 1 to avoid them being damaged.

However, for certain applications in which the flame detection system does not operate continuously, it is not disadvantageous for at least one of the electrodes to be within the flame.

As already mentioned above, during experiments performed within the framework of the invention, it has been shown that during operation (which is to say when arc 6 is produced between the ends of electrodes 3 and 4), the voltage between terminals 3a and 4a is significantly different depending on whether flame 1 is present or not. In a more precise fashion, it has been shown that the voltage for triggering the arc between electrodes 3 and 4 has a value which is higher in the absence of the flame. This property is illustrated in FIG. 2 which is a graph on which the abscissa represents time and the ordinate represents the voltage V between electrodes 3 and 4. The solid line of curve 10 shows variation in the voltage V in the absence of the flame and dot-dash line of curve 11 shows the variation in the voltage V in the presence of the flame.

In the absence of flame, the arc triggering voltage has a value $V_1$ and in the presence of the flame it has value $V_2$ which is considerably less than $V_1$. In the example, $V_1$ is the order of 5 KV and $V_2$ the order of 1 KV. This property is made use of in the system shown in FIG. 1, to transmit a flame detection signal. For this purpose, in this example, comparator 15 is included in which the first input (negative) 16 is connected to the output of capacitor 17 integrator via a high value resistor 18. The integrator input is connected to electrode 4. The second input (positive) 20 of comparator 15 is connected to output terminal 21 of a reference signal source (not shown). In the example, electrode 3 is connected to earth and thus capacitor 17 is connected between electrode 4 and earth.

The signal applied to input 20 of comparator 15 has a value representing a value $V_3$ (FIG. 2) intermediate between voltages $V_2$ and $V_1$. Thus in operation, capacitor 17 charges to voltage $V_1$ or $V_2$, depending upon whether there is a flame 1 or there is no flame 1; under these conditions, a signal only appears on the output of the said comparator 15 when flame 1 is present, which is to say when the signal on input 20 is greater than the signal on input 16.

The signal appearing on comparator 15 output can be used in various ways. Thus, when the flame protection system is used for monitoring an installation in which the flame must be continuously present, the output of the aforesaid comparator 15 is connected to the input of the generation means for an audible or luminous signal which is triggered when the output signal of the said comparator disappears. Disappearance of comparator 15 output signal can also be used to cause a combustible fluid supply valve (not shown) to be closed.

In the preferred application of the system conforming to the invention, arc 6 is used not only to detect presence of the flame but also to cause it to appear, thus, the system conforming to the invention then has the double function of ignition and detection. Additionally, as an example, the flame detection system is used to cause generator 5 to stop operating. For this purpose, this is adapted to include an inhibit input 25, which is connected via connection 26 shown in dotted lines on FIG. 1 to the output of the comparator 15. Thus from the instant when the flame is produced generator 5 operation is stopped.

The last system described is particularly interesting for implementing an ignition system for a pocket lighter, a system in which generator 5 has a power supply source which is composed of a reduced capacity battery. Under these conditions, the battery output is particularly low. Four examples for implementing such an ignition circuit will be described later in relation with FIGS. 3 and 7. This system is particularly advantageous inasmuch as it does not require the presence of an additional flame detection component or electrode. Additionally, the response times and consumption of the additional means required for the aforesaid detection are at a particularly low level.

The ignition circuit shown on FIG. 3 is analogous to that described in the third addition certificate No. 72 43 967 filed Dec. 11, 1972, in France, of French Pat. No. 72 02 407, filed Jan. 25, 1972, in France, granted to the applicant. This circuit has battery 30 which can be a single element battery, which feeds oscillator circuit 31 with transistors 32 and 33. In the collector of transistor 33 circuit is winding 34 which has a high magnification factor. Oscillator 31 input is connected to the output of inhibition device 35 which in this example is composed of thyristor 36. Device 35 output is composed of thyristor 36 cathode, this cathode being connected to transistor 32 base. The said thyristor is connected to transistor 32 collector as well as to the positive pole (+) of source 30, via switch 37. The point common to transistor 32 base and thyristor 36 cathode is connected to the negative pole (−) of the source via resistor 38. Device 35 input is composed of the gate or trigger terminal of the said thyristor 36.

The voltage taken from winding 34 is used for charging capacitor 40 via diode 41. A circuit for discharging capacitor 40 is provided, which includes thyristor 42, on the one hand, and primary winding 43 of voltage step-up transformer 44, on the other hand, to the terminals of secondary winding 45 of which are connected electrodes 3 and 4. To ensure discharge of capacitor 40 to a well specified value, triggering means for thyristor 42 are included, having Zener diode 46 of which the anode is connected to thyristor 42 trigger and of which the cathode is connected to the anode of the said thyristor 42; resistor 47 is installed between the trigger and cathode of thyristor 42.

In the above mentioned addition certificate No. 72 43 967, operation of oscillator 31 is stopped at the instant when capacitor 40 discharges by means of a connection between thyristor 42 trigger and the input of inhibition device 35. In the ignition circuit conforming to the invention which is shown on FIG. 3, the oscillator is stopped operating in a different way. In a more precise fashion, an inhibit signal is applied to the input of device 35 only when the flame has been produced. For this purpose, as in the flame detection system described in relation with FIG. 1, a comparator 15a is used. However, differently from the system shown in FIG. 1, the first input (−) 16a of comparator 15a is not connected—via integrating capacitor 17a—to electrodes 3 and 4 but to primary winding 43 of transformer 44. Besides this a diode 49, the purpose of which will be explained later, is connected in series with capacitor 17a. Finally, comparator 15a output is connected with thyristor 36 trigger.

Operation of the ignition system described in relation with FIG. 3 can now be explained with the aid of FIG. 4 diagram.

FIG. 4 is a graph on which the abscissa is time and the ordinate the voltage V appearing across primary winding 43 terminals. Curve 51 on this graph drawn in dots and dashes shows the variations of voltage V in the absence of the flame and curve 50 in a solid line shows the variations of the aforesaid voltage V as a function of time when the combustible gas has been ignited, which is to say in the presence of the flame. These curves 50 and 51 result from experiments performed within the framework of the invention. As can be seen, after capacitor 40 has discharged (this discharge corresponding to part 52 of curves 50 and 51), oscillations which decay with time appear across primary winding 43 terminals. The amplitudes of these oscillations is greater when the flame is absent compared with when the flame is present. This is the property which is used in the system shown in FIG. 3. In a more precise fashion, the amplitude of the first oscillation 54 is stored by capacitor 17a and specifies the value of comparator 15a output signal. Diode 49 prevents capacitor 17a being charged for the positive part of the discharge of capacitor 40. Operation of the system shown in FIG. 3 is analogous to that shown on FIG. 1 for the amplitude of the damped oscillations (4) depends on the voltage between electrodes 3 and 4 and/or the impedance presented by the arc between the electrodes, which is equivalent to the same thing.

The ignition system comforming to the invention illustrated in FIG. 5 is, as that described in relation with FIG. 3, analogous to the circuit described in addition certificate No. 72 43 967. In this example, as in the above-mentioned addition certificate, connection 60 is provided between the triggers of thyristors 42 and 36, this link being performed via resistor 61.

One knows that the triggering of thyristor 42, which is to say the discharge of capacitor 40, causes transmission of a positive polarity pulse 62 to thyristor 36 trigger and therefore stops operation of oscillator 31. In the example shown on FIG. 5 positive polarity pulse 62 is compensated by negative polarity pulse 63 as long as a flame has not been produced. On the other hand, when the flame has been produced, such a negative pulse acting in opposition to positive pulse 62 is not applied to thyristor 36 trigger.

To implement the systems described above, in the example, secondary winding 45 of transformer 44 is wound in the opposite direction from that of primary winding 43. Additionally, the terminal of winding 45 is connected to electrode 4 and connected to earth via two resistors 65 and 66 forming a voltage divider. The common point between these two latter resistors is connected to the anode of Zener diode 67 the cathode of which is connected to thyristor 36 trigger. Diode 67 cathode is connected to earth via resistor 68 and a low value integrating capacitor 69 is provided in parallel with this resistor 68.

Zener diode 67 trigger voltage is selected in such a way (in relation with the values of resistors 61, 65, 66 and 68) that the said diode is triggered (made to conduct in reverse direction) in the absence of the flame, diode 67 remaining non-conducting and reverse biased when the gas has been ignited. In effect, in the presence of flame, the negative pulse 70 transmitted by transistor 65 has an amplitude significantly less than that of pulse 63 in the absence of the flame. Under these conditions, the desired result is obtained, which is to say that negative pulse 63 compensates for positive pulse 62 in the absence of flame; on the other hand, pulse 62 is not compensated in the presence of a flame and operation of an oscillator 31 can therefore be interrupted.

We are now going to describe in relation with FIG. 6 another mode for implementing the ignition system conforming to the invention in which is provided as in the case of FIG. 5, means allowing thyristor 36 to be triggered, and therefore production of sparks to be stopped, only when the flame has been produced. For this purpose, connection 60a between primary winding 43a of output transformer 44a and thyristor 36 trigger is connected.

In this example, for reasons explained below, the primary 43a and secondary 45a windings of transformer 44a are wound in opposite directions. Resistor 100 is connected in series with winding 45a between the terminal of this winding and earth; this resistor 100, which has a low value, 68 ohms in the example, has the purpose of producing a voltage between the terminals which is proportional to the value of electric current between spark gap electrodes 3 and 4. A signal representing this voltage is applied to transistor 103 base, in this the common terminal of resistor 100 and winding 45a is connected to transistor 103 base via resistor 101 and diode 102.

In the example transistor 103 is an NPN type and its collector is connected to thyristor 36 trigger, whilst its emitter is connected to earth. Resistor 104 is also connected between thyristor 36 trigger and earth.

The inventor has shown that in the absence of flame the level of current passing through winding 45a varies as a function of time as shown in diagram 110. The positive part 111 of this diagram corresponds to the appearance of the first half-cycle of the damped oscillations. Additionally, the inventor has shown that the amplitude of this half-cycle 111 varies with the arc triggering voltage and in practice such a half-cycle does not appear in the presence of a flame. It should be noted here that diagram 110 is analogous, with change of sign—as a result of direction of windings—to the diagram shown in FIG. 4 (diagram corresponding to the damped oscillations transmitted to transformer 44 primary).

These damped oscillations are caused by the presence of the oscillating circuit (generally stray) composed of the inductance of winding 45a and the distributed capacitance of the latter, these damped oscillations presenting an amplitude which becomes higher as the voltage across the terminals of secondary winding 45a becomes greater; the amplitude of these oscillations therefore becomes greater as the trigger voltage becomes greater.

It should be noted here that diode 102 prevents transmission of the negative half-cycle 110a (diagram 110) to the base of transistor 103, a half-cycle which could possibly damage the transistor.

In the absence of the flame, positive half-cycle 111 causes transistor 103 to conduct. Under these conditions, the pulse transmitted by wire 60a triggers thyristor 36 and therefore interrupts operation of the oscillator.

The example of the ignition system conforming to the invention which is shown on FIG. 7 can be distinguished from that shown on FIG. 6 by the fact that there is no connection (60a) between transformer 44a primary and the trigger of the control device for the oscillator using transistors 32 and 33. In this example, the signal representative of generation of a spark (signal transmitted by connection 60 or 60a in FIG. 5 or 6) is the negative half-cycle 110a (diagram 110, FIG. 6), depending on the value of the current level passing through secondary winding 45a.

To implement this system, the control device for the oscillator using transistors 32 and 33 includes, instead of an ordinary thyristor, a bi-stable component 36a such as that of BRY 39 of the company "La Radiotechnique-Coprim-R.T.C." A bi-stable component of this type is analogous to a thyristor and includes two control electrodes 120 and 121; electrode 120 is called the "anode gate, or anode trigger" whilst electrode 121 is called the "cathode gate, or cathode trigger".

The common point of secondary winding 45a and resistor 100 is connected to anode trigger 120 via resistor 122. Trigger 120 is also connected to the positive pole of the power supply battery via resistor 123. Capacitor 124 is connected between trigger 120 and the anode of component 36a. The said common point of winding 45a and resistor 100 is also connected to the base of transistor 103a of NPN type via resistor 101a and diode 102a. Transistor 103 collector is connected to cathode trigger 121 on one hand and to earth via resistor 104a on the other hand. Finally, transistor 103 emitter is connected to earth.

In operation, the negative half-cycle 110a which is transmitted to anode trigger 120 of component 36a is able to cause the latter component to conduct, and therefore to interrupt operation of the ignition circuit. This condition is satisfied if the cathode trigger has a positive potential; this situation being produced when transistor 103a is no longer conducting, which is to say when the positive half-cycle 111 has a negligeable amplitude in the presence of the flame. On the other hand, in the absence of flame, positive half-cycle 111 causes transistor 103a to conduct and trigger 121 of component 36a is therefore taken to earth potential; under these conditions, the said component 36a cannot be made to conduct and the operation of oscillator 36a using transistors 32 and 33 cannot be interrupted.

In the examples described up to the present, the system conforming to the invention is used to detect presence or absence of a flame. However this system can also be used to detect presence or absence of an electric arc (spark) between electrodes 3 and 4. In effect, if the electric arc does not trigger (whether or not the flame is present) the voltage between the electrodes reaches a value which is significantly greater than in the case when sparks are produced. This system can be used, for example to control whether or not the combustible gases arrive in the neighbourhood of the electrodes in a boiler (not shown). Thus comparison with a first threshold allows the supply of the fuel—when one is certain that sparks have been produced between the electrodes—and comparison with a second threshold allows the ignition system to be stopped operating (after the flame has appeared).

The system described in relation with the figures can be applied to numerous applications. Besides being used in a lighter (pocket or table), this system can be used, for example, for monitoring a flame in both domestic and industrial installations. The ignition system conforming to the invention can also be used to implement an internal combustion engine ignition circuit. In this case the spark plug is the spark gap. With this ignition circuit one can practically ensure an explosion on each cycle. It is understood that it is then necessary to select the periods separating the operating commands for generation of the sparks to a value compatible with the engine rotation speed.

In addition to those already mentioned above the monitoring or ignition system for a combustible fluid conforming to the invention has numerous advantages. In particular it should be noted that a flame monitoring system conforming to the invention has a particularly high operational reliability; and in addition it is particularly simple and economic to implement.

As it will be clear and as is apparent from the preceding, the invention is in no way limited in its modes of application and implementation which have been proposed in particular, on the contrary it embraces all variations.

I claim:

1. Flame ignition apparatus comprising a combination of a flame detection system and a flame generator associated therewith, wherein said flame generator comprises:

an autonomous direct current source;
a manual switch;
a controlled switch having a control electrode means;
voltage step-up means comprising oscillator means and connected to said autonomous direct current source through said manual switch to be supplied DC energy by said source, said oscillator means being furthermore operatively connected to said controlled switch so that said control electrode means constitutes an inhibit input of said oscillator means;
a capacitor connected to the output of said voltage step-up means;
a voltage step-up transformer having a primary winding and a secondary winding;
a spark gap arranged between two electrodes, said electrodes being connected to said secondary winding;
a burner connected to a combustible fluid source and located close to said spark gap;
a triggered discharge circuit connected between said capacitor and said primary winding,
and wherein said flame detection system comprises:
means sensitive to a varying voltage in said voltage step-up transformer including means sensitive to the triggering voltage of the electric arc between said electrodes;
reference generating means for generating a reference voltage at least at each spark generation, and comparator means connected to said reference generating means and to said means sensitive to a varying voltage for comparing the voltages generated thereby; an output of said comparator means being connected to said control electrode means of said controlled switch for transmitting thereto a signal representative of the presence and absence of a flame at said spark gap.

2. Apparatus according to claim 1, wherein said means sensitive to a varying voltage includes input terminals connected to the respective terminals on the secondary winding of the said transformer.

3. Apparatus according to claim 1, wherein said means sensitive to a varying voltage in said voltage set-up transformer includes input terminals connected to the respective terminals of the primary winding of said transformer.

4. Apparatus according to claim 1, wherein said means sensitive to a varying voltage includes an integrator able to integrate the voltage between the aforesaid electrodes for each spark, and comparator means of which the first input is connected to the output of the said integrator and the second input of which is connected to a reference source able to supply a signal representing a voltage of which the value is between a first predetermined value corresponding to the presence of an electric arc between said electrodes and a second pre-determined value corresponding to the absence of an electric arc between said electrodes.

5. Apparatus according to claim 1, wherein said means sensitive to a varying voltage includes a threshold component, such as a Zener diode, the conduction of which is a function of a voltage of specified value.

6. Apparatus according to claim 1, wherein said means sensitive to a varying voltage includes means sensitive to the current passing through the primary or secondary winding of the aforesaid transformer.

7. Apparatus according to claim 1, wherein said oscillator means converts the direct current voltage supplied by the aforesaid autonomous direct current source into a periodic signal, and wherein said voltage step-up transformer comprises a winding supplied by the oscillator means and rectifier means, the said capacitor being charged by the voltage step-up means via the aforesaid rectifier means.

8. Apparatus according to claim 7, characterized in that the aforesaid controlled switch is composed of a controlled rectifier of thyristor type the trigger of which constitutes an inhibit input operated by said signal transmitted by said comparator means.

9. Apparatus according to claim 7, characterized in that the aforesaid controlled switch includes an inhibit input connected to the output means able to supply a signal representing a spark produced by the aforesaid spark gap and that the output of said means sensitive to a varing voltage is also connected to the aforesaid inhibit input via a selective cancellation means able to supply a signal opposed to the signal supplied suited for supplying the signal representing a spark, in the absence of flame.

10. Apparatus according to claim 9, characterized in that the selective cancellation means includes a threshold component, such as a Zener diode.

11. Apparatus according to claim 9, characterized in that the selective cancellation means includes a branching component able to have a first and second conduction states when said means sensitive to a varying voltage transmit first level and second level signals respectively.

12. Apparatus according to claim 11, characterized in that it includes an output transformer the windings of which are wound in opposite directions, the primary winding of this output transformer being connected to the aforesaid inhibit input, in which the aforesaid branching means are connected in parallel on this inhibit input, in that the means sensitive to the varying voltage include means sensitive to the current level passing through the transformer secondary winding, the aforesaid branching means including a control input connected to the output of the said means sensitive to the current level in the secondary winding of the said transformer.

13. Apparatus according to claim 12, characterized in that the branching means include a transistor the base of which constitutes the control input.

14. Apparatus according to claim 1, wherein said oscillator means comprises a transistor having a base electrode, and a biasing circuit for said base electrode, said biasing circuit being connected to said controlled switch, said controlled switch comprising a thyristor-type element.

* * * * *